(12) United States Patent
Varnica et al.

(10) Patent No.: US 8,935,601 B1
(45) Date of Patent: *Jan. 13, 2015

(54) POST-PROCESSING METHODOLOGIES IN DECODING LDPC CODES

(71) Applicant: Marvell International Ltd., Hamilton (BE)

(72) Inventors: Nedeljko Varnica, San Jose, CA (US); Yifei Zhang, Milpitas, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 128 days.

This patent is subject to a terminal disclaimer.

(21) Appl. No.: 13/628,100

(22) Filed: Sep. 27, 2012

Related U.S. Application Data

(60) Provisional application No. 61/540,110, filed on Sep. 28, 2011.

(51) Int. Cl.
  *G06F 11/00* (2006.01)
  *H03M 13/00* (2006.01)
  *H03M 13/11* (2006.01)

(52) U.S. Cl.
  CPC ...... *H03M 13/1111* (2013.01); *H03M 13/1142* (2013.01); *H03M 13/1105* (2013.01)
  USPC ............ 714/800; 714/752; 714/755; 714/758

(58) Field of Classification Search
  CPC ..................... H03M 13/1105; H03M 13/1111; H03M 13/1142
  USPC .................................. 714/752, 755, 758, 800
  See application file for complete search history.

(56) References Cited

U.S. PATENT DOCUMENTS

| | | | |
|---|---|---|---|
| 7,191,378 B2 | 3/2007 | Eroz et al. | |
| 7,373,585 B2 | 5/2008 | Yedidia et al. | |
| 7,500,172 B2 | 3/2009 | Shen et al. | |
| 7,627,810 B2 | 12/2009 | Glazer et al. | |
| 2002/0010892 A1 | 1/2002 | Lodge et al. | |
| 2005/0044475 A1 | 2/2005 | Yedidia et al. | |
| 2005/0193320 A1* | 9/2005 | Varnica et al. | 714/800 |
| 2007/0234184 A1 | 10/2007 | Richardson | |
| 2008/0126908 A1 | 5/2008 | Lin | |
| 2008/0235559 A1 | 9/2008 | Yang | |
| 2008/0244360 A1 | 10/2008 | Mokhlesi et al. | |
| 2008/0301517 A1 | 12/2008 | Zhong | |

(Continued)

OTHER PUBLICATIONS

Han, Yang and William E Ryan, LDPC Decoder Strategies for Achieving Low Error Floors, 2008, Department of Electrical and Computer Engineering—University of Arizona, pp. 1-10.

*Primary Examiner* — Sam Rizk

(57) ABSTRACT

Systems and methods for decoding a received codeword are provided. The received codeword is decoded based on a parity code to produce a plurality of checks. A first unsatisfied check is selected from the plurality of checks, and a first set of symbol positions in the received codeword that are connected to the first unsatisfied check is identified. A second set of symbol positions in the received codeword that are not connected to the first unsatisfied check is identified. The received codeword is modified by setting the first set of symbol positions to first predetermined values and by setting the second set of symbol positions to second predetermined values. The modified received codeword is decoded based on the parity code.

18 Claims, 13 Drawing Sheets

(56) References Cited

U.S. PATENT DOCUMENTS

| | | |
|---|---|---|
| 2009/0313525 A1 | 12/2009 | Savin et al. |
| 2010/0042890 A1 | 2/2010 | Gunnam |
| 2010/0042904 A1 | 2/2010 | Gunnam |
| 2010/0042905 A1 | 2/2010 | Gunnam et al. |
| 2011/0078548 A1 | 3/2011 | Xin |
| 2011/0083058 A1 | 4/2011 | Hu et al. |
| 2011/0311002 A1 | 12/2011 | Li et al. |
| 2013/0290806 A1* | 10/2013 | Zhang et al. .......... 714/752 |

* cited by examiner

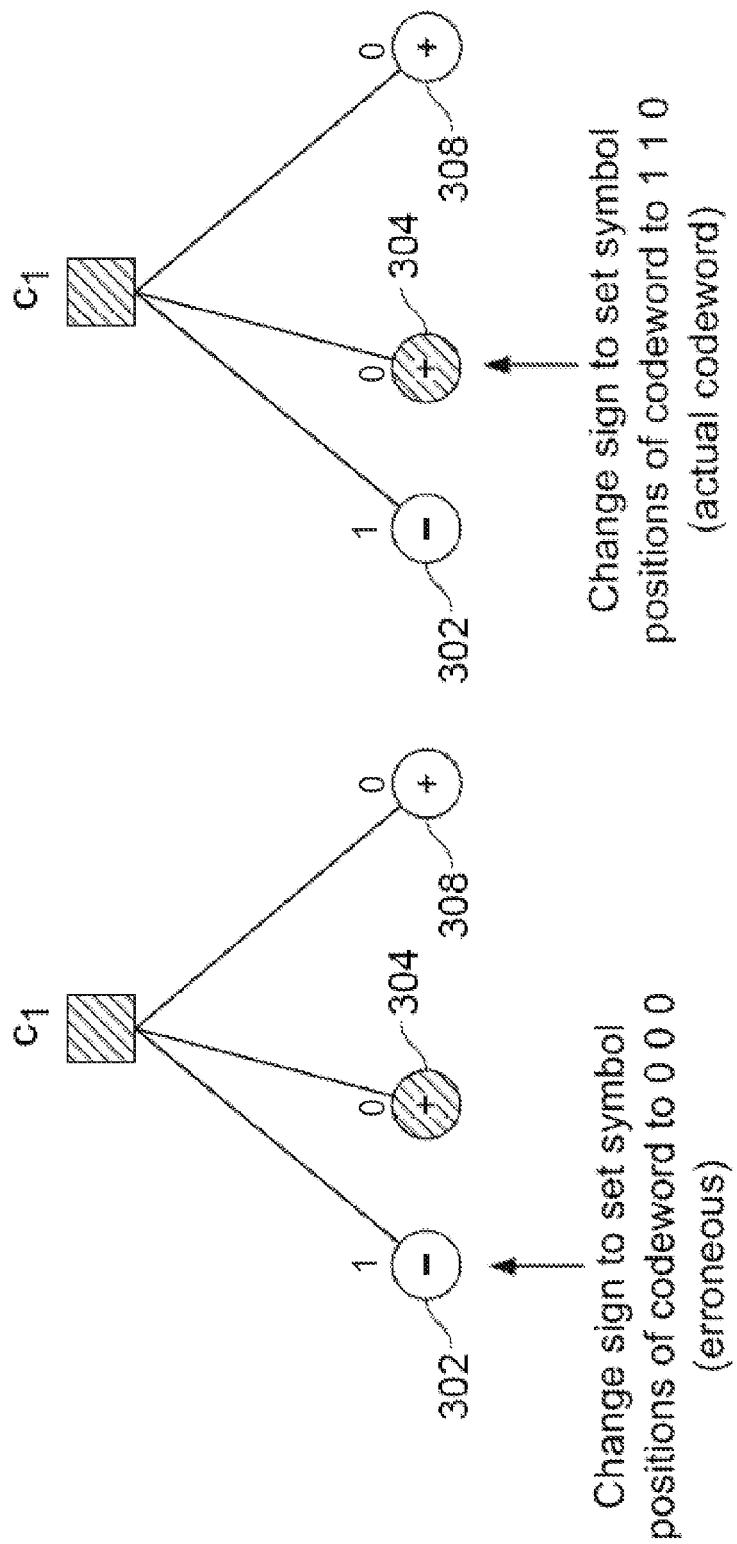

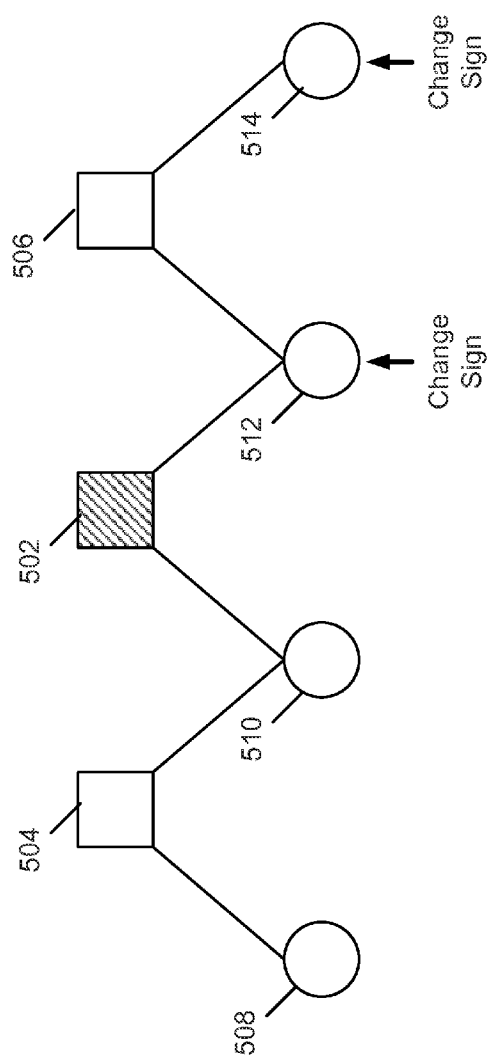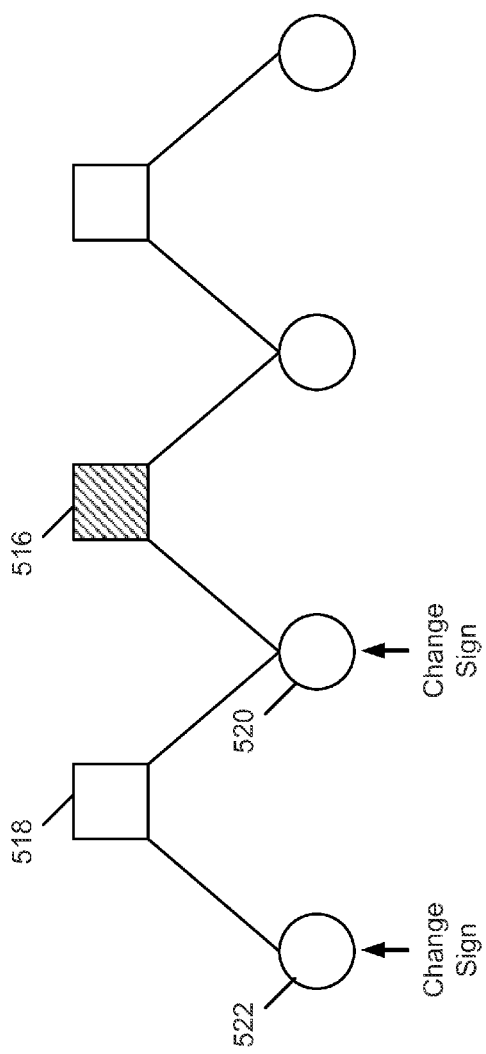

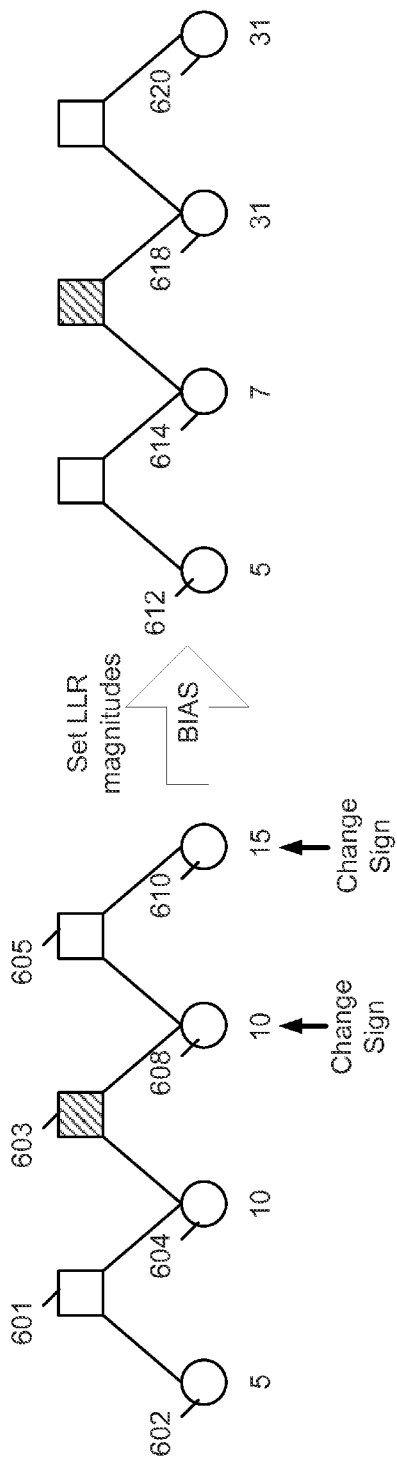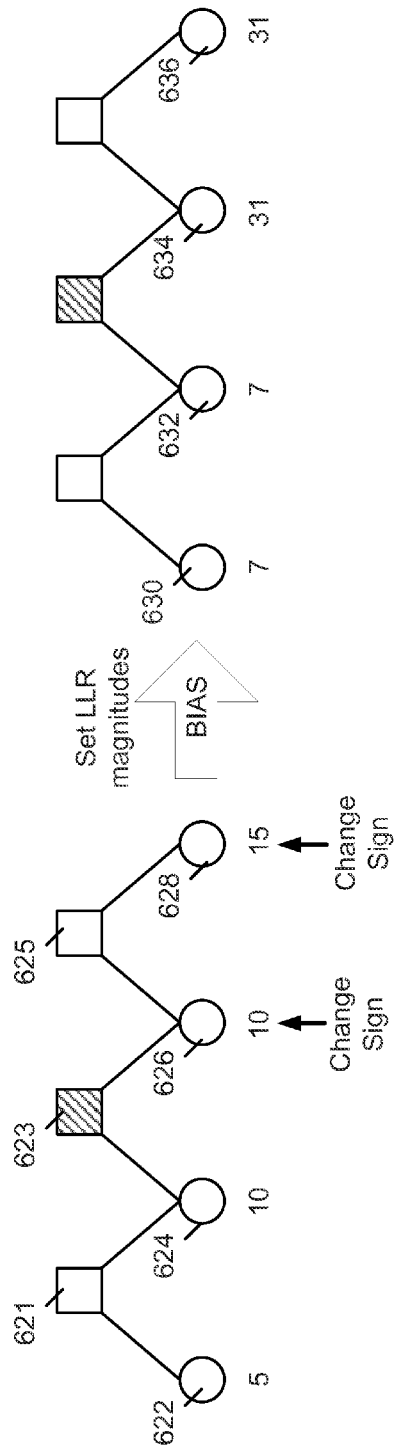

POST-PROCESSING METHODOLOGIES IN DECODING LDPC CODES

CROSS-REFERENCE TO RELATED APPLICATIONS

This application claims priority to U.S. Provisional Patent Application No. 61/540,110, filed Sep. 28, 2011, entitled "Message Biasing Post-Processing Methodologies in Decoding LDPC Codes," which is herein incorporated by reference in its entirety. This application is related to U.S. patent application Ser. No. 12/327,627, filed Dec. 3, 2008, entitled "Post-Processing Decoder of LDPC Codes for Improved Error Floors," and U.S. Provisional Application No. 60/991,905, filed Dec. 3, 2007, entitled "Post-Processing Decoder of LDPC Codes for Improved Error Floors," the disclosure of both of which is herein incorporated by reference.

TECHNICAL FIELD

The technology described herein relates generally to decoding data and more particularly to decoding data using low-density parity check (LDPC) codes.

BACKGROUND

Transmission of information by a transmitter to a receiver may occur over a noisy communications channel. Because of the noisy communications channel, the receiver may receive a distorted version of the information originally transmitted by the transmitter. An example of a noisy communications channel may be a hard disk, where the hard disk accepts information from a "transmitter" (i.e., writer), stores the information, and then provides a distorted version of that information to a "receiver" (i.e., reader) when the information is accessed. The distortion caused by the hard disk may be great enough to cause a channel error, such that the receiver can receive erroneous information bits (i.e., the receiver may interpret a bit in an output signal as a 1 when a corresponding bit in the input signal was a 0, or vice versa). Channel errors may reduce throughput, cause data to be read incorrectly, and/or cause other undesirable events.

Low-density parity check (LDPC) coding is one method of detecting and correcting channel errors. LDPC codes are error-correcting codes that can be used to communicate information more reliably over a noisy communications channel. LDPC codes may provide error correction capabilities and enable the transmission of data at higher rates (e.g., rates that approach a theoretical maximum transmission rate of the channel).

SUMMARY

The present disclosure is directed to systems and methods for decoding a received codeword. In a method for decoding a received codeword, the received codeword is decoded based on a parity code to produce a plurality of checks. A first unsatisfied check is selected from the plurality of checks, and a first set of symbol positions in the received codeword that are connected to the first unsatisfied check is identified. A second set of symbol positions in the received codeword that are not connected to the first unsatisfied check is identified. The received codeword is modified by setting the first set of symbol positions to first predetermined values and by setting the second set of symbol positions to second predetermined values. The modified received codeword is decoded based on the parity code.

In a system for decoding a received codeword, a decoder is configured to decode the received codeword or a modified received codeword based on a parity code. The decoding of the received codeword is configured to produce a plurality of checks. The system includes a post processor configured to perform operations including selecting a first unsatisfied check from the plurality of checks and identifying a first set of symbol positions in the received codeword connected to the first unsatisfied check. The post processor is further configured to select a second set of symbol positions in the received codeword not connected to the first unsatisfied check and to modify the received codeword. The modifying of the post processor includes the operations of setting the first set of symbol positions to first predetermined values and setting the second set of symbol positions to second predetermined values.

The present disclosure is further directed to another method for decoding a received codeword. In the method, the received codeword is decoded based on a low-density parity check code to produce a plurality of checks and a tentative codeword. The received codeword is modified, where the modifying includes identifying a cycle having a predetermined size, the cycle being a closed loop of a code graph produced as a result of decoding the received codeword and being connected to a first unsatisfied check from the plurality of checks. The modifying further includes setting one or more symbol positions of the cycle to signs opposite of those of corresponding symbol positions in the tentative codeword and setting a remainder of symbol positions of the received codeword to same signs as those of corresponding symbol positions in the tentative codeword. The modified received codeword is decoded based on the low-density parity check code.

BRIEF DESCRIPTION OF THE FIGURES

FIGS. 4A and 4B illustrate an example technique for changing inputs to an LDPC decoder using an LDPC post-processor.

FIGS. 5A and 5B illustrate another example technique for changing inputs to an LDPC decoder using an LDPC post-processor that allows for multiple symbol positions to be biased.

FIGS. 6A and 6B illustrate an example technique for choosing LLR magnitude values when changing inputs to an LDPC decoder using an LDPC post-processor.

DETAILED DESCRIPTION

Figure 1:
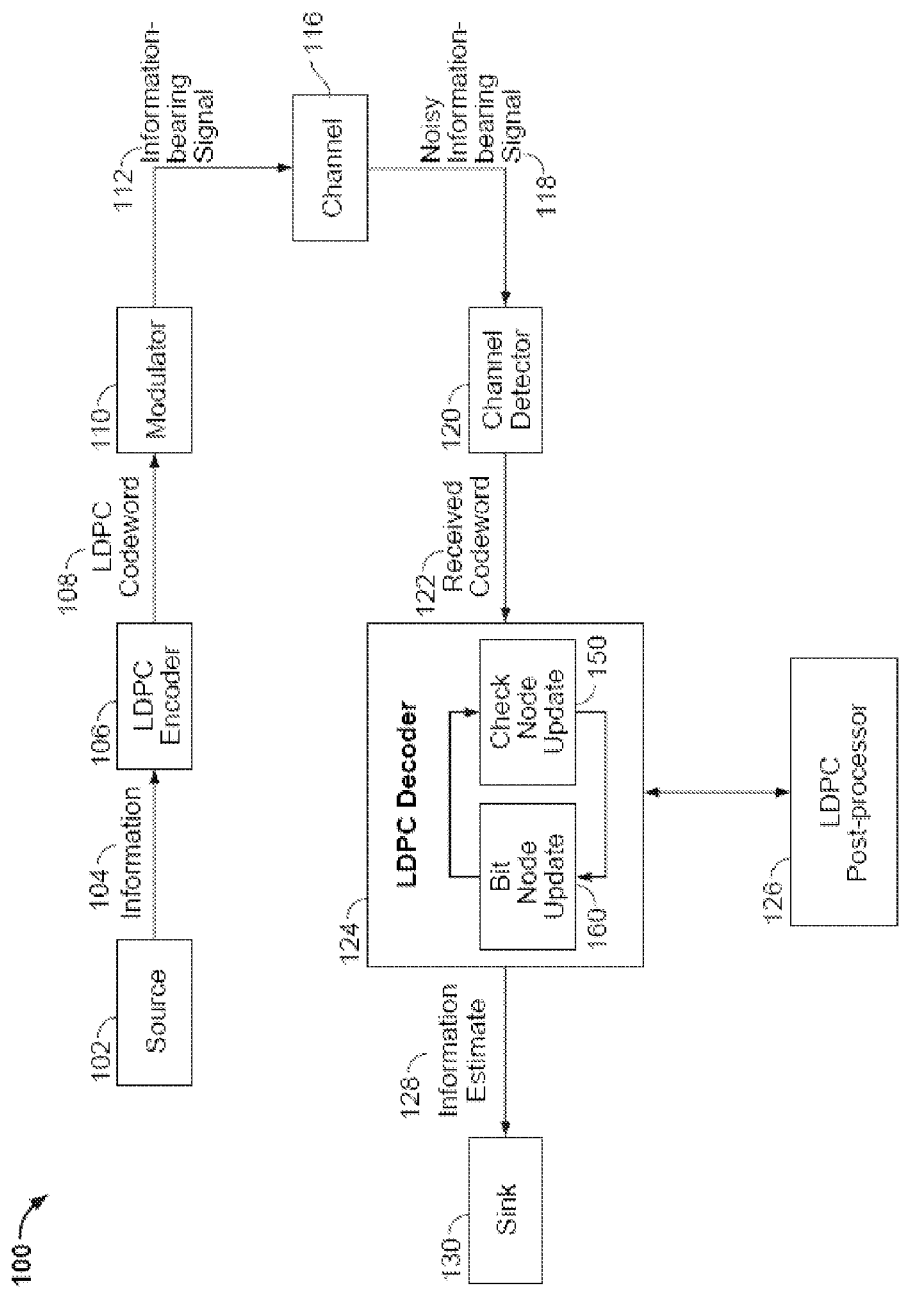
FIG. 1 depicts a block diagram of an example data communications system utilizing parity codes.

FIG. 1 depicts a block diagram of an example data communications system 100 utilizing parity codes. System 100 includes a source of information 102, LDPC encoder 106, modulator 110, channel 116, channel detector 120, LDPC decoder 124, LDPC post-processor 126, and sink 130. The system 100 is used to transmit information 104 from the source 102 to the sink 130 through the channel 116. Alternatively, the system 100 may be used to store the information 104 from the source 102 in the channel 116, such that the information 104 may be later retrieved from the channel 116 and provided to the sink 130. The channel may be, for example, a wired or wireless communications medium or a storage device (e.g., a hard disk, random access memory, FLASH memory, CD-ROM, DVD-ROM).

The LDPC encoder 106 and modulator 110 prepare the information 104 for transmission through the channel 116 or storage in the channel 116. The LDPC encoder 106 encodes the information 104 to produce an LDPC codeword 108, such that the LDPC codeword 108 satisfies coding constraints of an LDPC code employed by the encoder 106. The LDPC code used by the encoder 106 may be selected to achieve particular communication or storage performance characteristics (e.g., a particular bit error rate). The modulator 110 converts the LDPC codeword 108 into an information-bearing signal 112 that is suitable for transmission through or storage in the channel 116. The modulator 110 may achieve the conversion using a variety of modulating techniques (e.g., pulse amplitude modulation, quadrature amplitude modulation, phase shift keying, or orthogonal frequency division multiplexing).

The channel 116 may be a noisy communications channel, such that the information-bearing signal 112 may be altered, distorted, and/or degraded when it is transmitted through or stored in the channel 116. A noisy information-bearing signal retrieved from the channel 116 may be substantially different from the information-bearing signal 112 that entered the channel 116, which may cause a receiver to receive erroneous bits of information (i.e., the receiver may interpret the output signal as a 1 when the input signal was a 0, or vice versa). To address the alteration, distortion, and/or degradation of the information-bearing signal 112, the system 100 includes an LDPC decoder 124 and an LDPC post-processor 126. These components are used to more accurately interpret the noisy information-bearing signal 118, in order to avoid the receipt of erroneous bits at the receiver.

A channel detector 120 is used to demodulate the noisy information-bearing signal 118 to produce a received codeword 122. The LDPC decoder 124 decodes the received codeword 122 using the same LDPC code employed by the encoder 106. The decoding of the LDPC decoder 124 produces an information estimate 128. An objective of the LDPC decoder 124 may be to produce the information estimate 128 that reproduces the information 104 that was input into the LDPC encoder 106. This may occur, for example, if there are sufficiently few errors in the received codeword 122. As discussed in further detail below, in situations where the LDPC decoder 124 cannot produce the information estimate 128 that reproduces the input information 104, the LDPC post-processor 126 is used to aid the decoder 124 in reaching the desired outcome.

The LDPC decoder 124 includes a check node update module 150 and a bit node update module 160. These modules 150, 160 are used to perform iterative decoding to process the received codeword 122 in the LDPC decoder 124 (e.g., via min-sum and sum-product iterative message passing algorithms). In one example, the check node update module 150 first computes a plurality of messages at a plurality of checks (i.e., check nodes) for the received codeword 122 using a parity check matrix of the LDPC code employed by the encoder 106 and decoder 124. Each of the plurality of checks is associated with one or more symbol positions (i.e., bits) of the received codeword 122 and each is an unsatisfied check or a satisfied check. A check may be unsatisfied when there is at least one symbol position associated with the check in the received codeword 122 that is erroneous. A check may be satisfied when there are no symbol positions associated with the check in the received codeword that are erroneous.

The plurality of messages associated with the plurality of parity checks for the received codeword 122 are be used to pass information on which of the plurality of checks are unsatisfied, such that the LDPC decoder 124 can make modifications to the received codeword 122 to produce the information estimate 128 that reproduces the original input information 104. Thus, the check node update module 150 passes the check node messages to the bit node update module 160, which updates and/or performs correction on the symbols of the received codeword 122 using the check node messages and original values of the received codeword 122. The bit node update module 160 produces and passes the updated bit messages to the check node update module 150, which allows the check node update module 150 to re-compute or update the values of the checks (i.e., determine again whether each of the plurality of checks is satisfied or unsatisfied).

The check node update module 150 and the bit node update module 160 perform a plurality of iterations in this manner, where each of the plurality of iterations cause the bit node update module 160 to come closer to producing a codeword that reproduces the codeword 108 originally received by the channel 116. In one example, the LDPC decoder 124 may be configured to run a predetermined number of iterations, such that if the original codeword 108 cannot be reproduced in the predetermined number of iterations, further iterations are not performed. Alternatively, the decoder 124 may discontinue performing iterations when a valid codeword satisfying coding constraints of the LDPC code is produced. The bits produced by the bit node update module 160 after the LDPC decoder terminates execution may be referred to collectively as a tentative codeword. The tentative codeword, in contrast to other output codewords described below, is produced as a result of operations of the LDPC decoder 124 only and does not rely on the LDPC post-processor 126.

The check node update module 150 and the bit node update module 160 may compute their respective messages using soft-information. The soft-information indicates likely values of the checks and/or symbol positions and a reliability or confidence value associated with each of the likely values (e.g., for an 8-bit codeword, the soft-information may indicate, for each of the eight symbol positions of the codeword, a value indicating whether the symbol position is a 0 or a 1 and an associated confidence value indicating a likelihood that the value is correct). The decoder 124 may calculate the soft-information in the form of a log-likelihood ratio (LLR) value for each check and/or symbol position. For example, the decoder may calculate LLR values for a transmitted or stored symbol position bit $b_i$ according to:

$$\mathrm{LLR}(b_i) = \log((P(b_i=0))/(P(b_i=1))),$$

where $P(b_i=0)$ is a probability that the transmitted or stored bit is equal to 0, and $P(b_i=1)$ is a probability that the transmitted or stored bit is equal to 1. Using LLR values computed according to the above equation, a sign of the LLR value may indicate whether the transmitted or stored bit is more likely a zero or more likely a one (e.g., a negative LLR value may indicate a more likely one and a positive LLR value may indicate a more likely zero). The magnitude of the LLR value indicates the strength or confidence of the decoding, with higher magnitude values indicating a higher confidence. Checks may similarly be associated with soft-information that indicates how likely it is that the checks are satisfied or unsatisfied.

As noted above, in certain situations, the LDPC decoder 124 may not be able to produce a valid codeword that satisfies the coding constraints of the LDPC code employed by the LDPC encoder 106. This can occur where erroneous bits are located in symbol positions of the received codeword 122 that cause checks to reinforce, rather than correct, errors. For example, errors may remain after the LDPC decoder 124 performs a particular number of iterations when a number of erroneous bits in the received codeword 122 results in relatively few unsatisfied checks. In these situations involving relatively few unsatisfied checks, the set of erroneous symbols may be referred to as a near-codeword or a trapping set. Such near-codewords or trapping sets may be seen as being generally uncorrectable by the LDPC decoder, even after many iterations of an iterative decoding algorithm.

Figure 3:
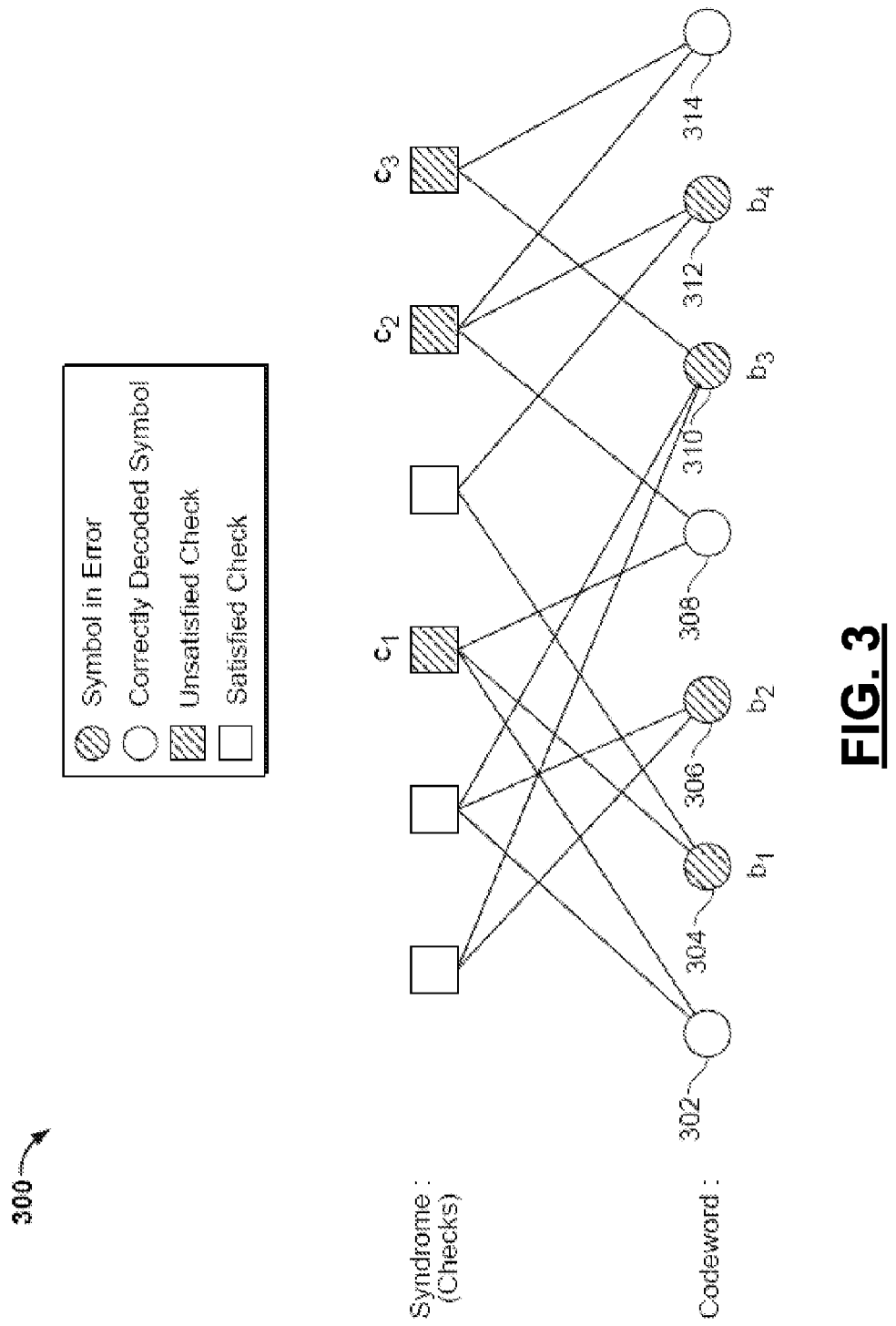
FIG. 3 depicts a Tanner graph for an example trapping set that may be found in a decoded codeword.

Referring briefly to FIG. 3, a graphical representation of an example trapping set 300 is illustrated. The graphical representation of FIG. 3 is commonly referred to as a "Tanner graph," where the squares represent checks (i.e., check nodes), the circles represent the bits or symbol positions of a codeword (i.e., bit nodes), and the lines (i.e., edges) connecting the squares and circles indicate connections or associations between the checks and the bit nodes. The edges thus indicate which checks are being used by the bit node update module 160 of FIG. 1 to update the LLR for each bit node and also which bits are being used by the check node update module 150 of FIG. 1 to update the LLR for each check node.

In the example trapping set 300 of FIG. 3, there are four erroneous bits indicated by shading, $b_1$, $b_2$, $b_3$, and $b_4$, as indicated at 304, 306, 310, and 312. Correct bits 302, 308, 314 are not shaded. The erroneous symbol positions represent errors present in a tentative codeword after a particular number of iterations executed by the LDPC decoder 124. In the example of FIG. 3, the symbol positions are associated with three unsatisfied checks, $c_1$, $c_2$, and $c_3$. The trapping set 300 may be referred to as a (4, 3) trapping set, to reference the number of erroneous symbol positions and the number of unsatisfied checks, respectively.

With reference again to FIG. 1, the LDPC decoder 124 may produce a tentative codeword with a trapping set similar to that illustrated in FIG. 3. As noted above, in situations involving trapping sets, the set of erroneous symbol positions may appear to be uncorrectable to the LDPC decoder 124. To address situations involving trapping sets, the system 100 includes the LDPC post-processor 126 to aid the LDPC decoder 124 in producing the correct codeword. The LDPC post-processor 126 aids the decoder 124 by changing certain inputs to the decoder 124 (i.e., modifying the received codeword 122), such that the decoder 124 can run additional iterations with the changed inputs. The changes made by the LDPC post-processor 126 may prevent the LDPC decoder 124 from producing an output that converges to the same trapping set as before.

Figure 2:
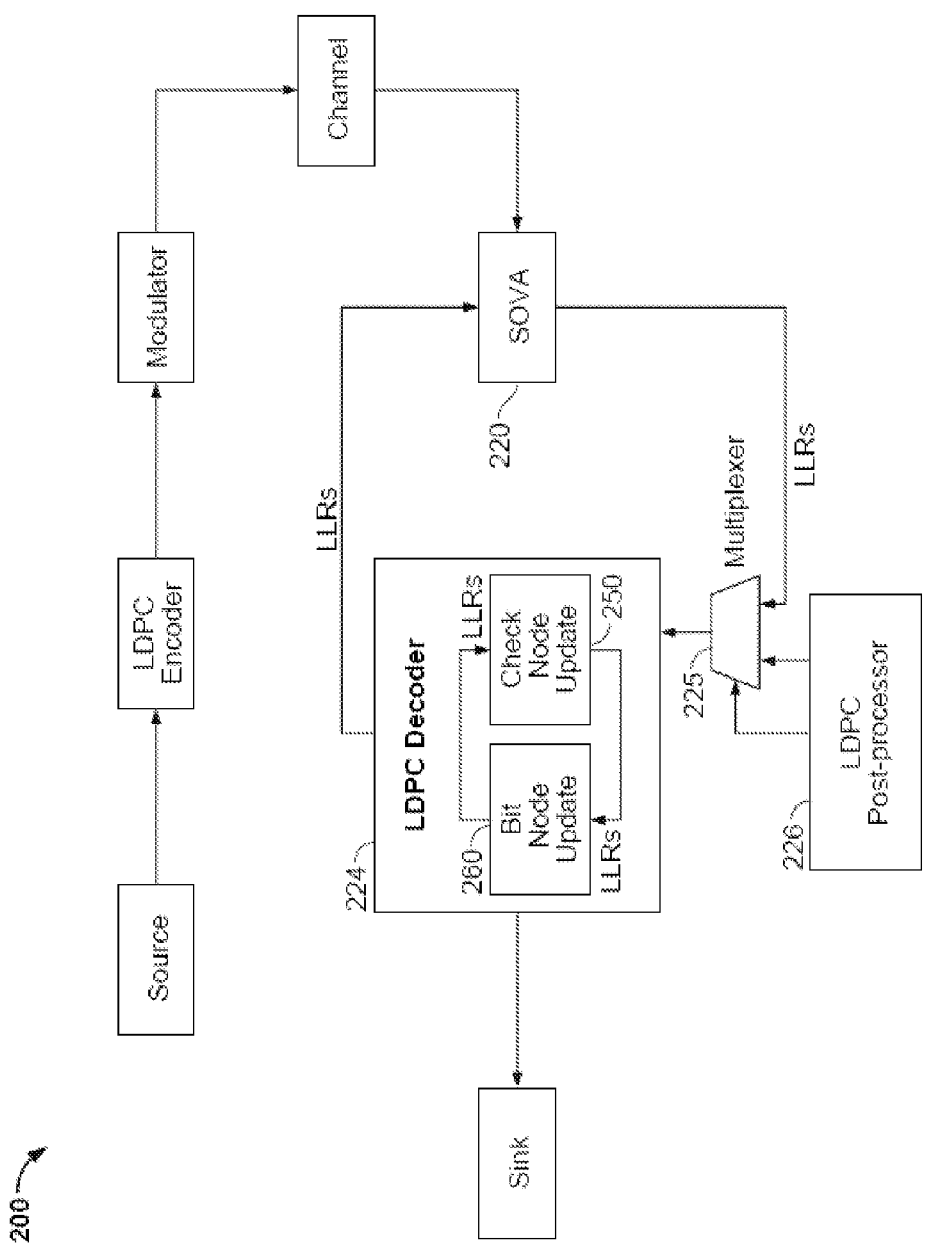
FIG. 2 depicts a block diagram of another example data communications system that uses an LDPC post-processor to aid in decoding received codewords.

FIG. 2 depicts a block diagram of another example data communications system 200 that uses an LDPC post-processor to aid in decoding received codewords. The system 200 includes similar features as the system 100 of FIG. 1. The system 200, in contrast to the system 100 of FIG. 1, however, includes a soft-output Viterbi algorithm (SOVA) module 220, which functions as a channel detector and is used to produce soft-information for the received codeword (e.g., LLR values). The SOVA module 220 and the LDPC decoder 224 are configured to perform a number of iterations. The SOVA module 220 passes LLR values to the LDPC decoder 224 to enable the decoder 224 to decode and produce a more reliable set of LLR values. Similarly, the LDPC decoder 224 passes LLR values to the SOVA module 220 to enable the SOVA module 220 to generate more reliable channel estimates. Thus, after each iteration between the SOVA module 220 and the LDPC decoder 224, the reliability of the data produced by the two elements may improve. Although the system 200 is depicted and described as including the SOVA module 220, it should be understood that other suitable channel detectors may be employed in its place (e.g., a BCJR channel detector).

The LDPC decoder 224 includes a check node update module 250 and a bit node update module 260 that iteratively update check and bit nodes, respectively. Thus, in interpreting a noisy information-bearing signal in the system 200, two types of iterations are used: iterations between the SOVA module 220 and the LDPC decoder 224 and iterations within the LDPC decoder 224 that occur between the check node update module 250 and the bit node update module 260. For each iteration between the SOVA module 220 and the LDPC decoder 224 (i.e., an outer iteration), the check node and bit node update modules 250, 260 perform a plurality of message-passing iterations (i.e., inner iterations). In each inner iteration, the check node update module 250 uses LLR values computed by the SOVA module 220 in the outer iteration and also the LLR values provided by the bit node update module 260 in the inner iteration.

As described above with respect to FIG. 1, even after a predetermined number of iterations, the LDPC decoder 224 may not produce a valid codeword if a trapping set is present in the tentative codeword produced by the decoder 224. Thus, the system 200 includes an LDPC post-processor 226 to change inputs (i.e., symbol position signs and LLR values of the received codeword) or other values within the LDPC decoder 224 so that the LDPC decoder 224 does not converge to the same trapping set as before. In one example, the LDPC post-processor 226 changes the channel detector inputs to the LDPC decoder 224 that would otherwise have been provided by the SOVA module 224. For example, the LDPC post-processor 226 can be used to invert (i.e., flip) signs of symbol positions that would otherwise have been provided by the SOVA module 220 to the decoder 224 and provide the inverted symbol positions to the decoder 224. To accomplish this, the system 200 includes a multiplexer 225 to select between the outputs of the SOVA module 220 and the LDPC post-processor 226.

The multiplexer 225 may be controlled by the LDPC post-processor 226. Thus, in one example, the LDPC post-processor 226 controls the multiplexer 225 to select the output of the SOVA module 220 for all bits in an initial set of decoding iterations performed by the decoder 224. This enables the decoder 224 to compute the tentative codeword using a standard decoding process that does not involve altered inputs provided by the LDPC post-processor 226. If errors are present in the tentative codeword that prevent the actual codeword from being determined (e.g., a trapping set is present in the tentative codeword), the LDPC post-processor 226 controls the multiplexer 225 to select the output of the post-processor 226 for some of the symbol positions and to select the output of the SOVA module 220 for a remainder of the symbol positions. The extra iterations performed with the inputs altered by the LDPC post-processor 226 may prevent the decoder 224 from converging to the same, erroneous codeword.

FIG. 3, described briefly above, depicts a Tanner graph for an example trapping set 300 that may be found in a decoded codeword. As noted above, the example trapping set may be referred to as a (4, 3) trapping set because it has four erroneous symbol positions $b_1$, $b_2$, $b_3$, and $b_4$ at 304, 306, 310, 312, and three unsatisfied checks $c_1$, $c_2$, and $c_3$. Using the checks associated with the tentative codeword symbol positions 302, 304, 306, 308, 310, 312, 314, an LDPC post-processor identifies candidate symbol positions of the tentative codeword that are potentially erroneous. After identifying the potentially erroneous symbol positions, the LDPC post-processor changes the inputs to an LDPC decoder that correspond to the symbol positions of the potentially erroneous bits. With reference to the example system 200 of FIG. 2, the LDPC post-processor 226 controls the multiplexer 225 to change the inputs to one or more of the symbol positions 302, 304, 306, 308, 310, 312, 314. For a remainder of the symbol positions of the tentative codeword, the LDPC post-processor 226 controls the multiplexer 225 to provide the values output by the SOVA module 220.

FIGS. 4A and 4B illustrate an example technique for changing inputs to an LDPC decoder using an LDPC post-processor. In the example of FIGS. 4A and 4B, the LDPC decoder performs a set of initial iterations that produces a tentative codeword having a negative LLR value for symbol position 302 (indicating a likely bit value of 1) and positive LLR values for symbol positions 304 and 308 (indicating likely bit values of 0). If the symbol position 304 is erroneous in the tentative codeword, as denoted by its shading in FIGS. 4A and 4B, the actual values for the symbol positions is "1," "1," and "0," for positions 302, 304, and 306, respectively, and not "1," "0," and "0." To address the error in the tentative codeword, an LDPC post-processor inverts bit values of certain symbol positions and also resets LLR magnitude values for one or more of the symbol positions.

In choosing a sign value for the symbol positions 302, 304, 306, the LDPC post-processor may use a sign of the original LLR value (i.e., a sign of the LLR values in the tentative codeword produced after an initial set of iterations executed by the decoder without assistance of the LDPC post-processor) for all but one of the symbol positions. Thus, in FIG. 4A, the LDPC post-processor selects one symbol position associated with check node $c_1$ to assign a sign opposite of the original sign and sets the LLR value for the remaining bit nodes to a same sign as the original sign. This allows the LDPC post-processor to correct one of the symbol positions associated with check node $c_1$, which may or may not be the symbol position containing the error. As indicated in FIG. 4A, changing the sign of the symbol position 302 produces another erroneous codeword because the symbol position 302 was not in error and should not have been changed.

Because the LDPC post-processor inverted a symbol position bit value that did not need to be inverted in the example of FIG. 4A, the post-processor may, as illustrated in FIG. 4B, attempt a similar correction for another symbol position associated with the check $c_1$. For example, after the LDPC decoder performs decoding iterations with a correction to symbol position 302 (i.e., as illustrated in FIG. 4A), the LDPC post-processor may then invert the sign for the LLR value associated with the symbol position 304 and reset signs associated with the other symbol positions 302, 308 to their original values. The LDPC decoder can then run another set of iterations with the new LLR values. With the symbol position 304 inverted, the values of the symbol positions 302, 304, and 308 may converge to the correct values.

FIGS. 5A and 5B illustrate another example technique for changing inputs to an LDPC decoder using an LDPC post-processor that allows for multiple symbol positions to be biased. In FIG. 5A, checks 502, 504, 506 are produced as a result of the LDPC decoder performing a standard decoding on a received codeword (i.e., a decoding not assisted by the LDPC post-processor). Check 502 is unsatisfied, as denoted by its shading, and other checks 504, 506 are satisfied. Symbol positions 508, 510, 512, 514 are associated with these checks, with only certain symbol positions 510, 512 being directly connected to the unsatisfied check 502. In the example technique for changing inputs to the LDPC decoder illustrated in FIGS. 4A and 4B, if only one unsatisfied check is present, then a sign of only one symbol position is inverted. By contrast, in the example technique of FIG. 5A, even with only one unsatisfied check present, signs of at least two symbol positions can be inverted. In choosing the two symbol positions, a first symbol position to be inverted is chosen according to the example technique of FIGS. 4A and 4B, such that the first symbol position is one directly connected to an unsatisfied check. In FIG. 5A, the symbol position 512 is selected for inversion because of its direct connection to the unsatisfied check 502. A second symbol position to be inverted in the example technique of FIG. 5A is not directly connected to the unsatisfied check 502. Rather, the second symbol position to be inverted is a symbol position that is connected to a satisfied check, where the satisfied check is one that is directly connected to the first symbol position selected. Thus, in FIG. 5A, the symbol position 514 is the second symbol position selected for inversion because of its connection to the satisfied check 506, which is also directly connected to the first symbol position to be inverted 512.

Similarly, in FIG. 5B, if symbol position 520 is selected as a first symbol position to be inverted because of its direct connection to unsatisfied check 516, symbol position 522 is selected as a second symbol position to be inverted due to its connection to symbol position 520 via satisfied check 518. Choosing the first and second symbol positions in this manner may reflect the fact that changing the sign of only the first symbol position may cause the unsatisfied check to become satisfied while also simultaneously causing a satisfied check to which it is connected to become unsatisfied. Thus, by changing both the first and second symbol positions simultaneously, this technique may preemptively attempt to address the issue of a satisfied check becoming unsatisfied if only the first symbol position is inverted. In both FIGS. 5A and 5B, the symbol positions to be inverted may be biased with LLR magnitude values that are equal to a maximum absolute magnitude value for LLRs of the decoding system. The maximum magnitudes provide the LDPC decoder with information indicating a high level of certainty of a correctness of the LLR values provided by the LDPC post-processor, which may maximize an effect that the LDPC post-processor has on the decoding process.

FIGS. 6A and 6B illustrate an example technique for choosing LLR magnitude values when changing inputs to an LDPC decoder using an LDPC post-processor. In the examples of FIGS. 6A and 6B, symbol positions to be inverted are determined according to the example technique of FIGS. 5A and 5B, where a first symbol position is directly connected to an unsatisfied check, and a second symbol position is connected to the first symbol position through a common, satisfied check. FIGS. 6A and 6B expand on the example technique of FIGS. 5A and 5B by illustrating an example method for choosing LLR magnitude values for both the inverted symbol positions and the non-inverted symbol positions.

In FIG. 6A, symbol positions 602, 604, 608, 610 are associated with unsatisfied check 603 and satisfied checks 601,

605. These checks may be produced as a result of the LDPC decoder performing a standard decoding on a received codeword that is not assisted by the LDPC post-processor. Number values depicted below each of the symbol positions 602, 604, 608, 610 indicate LLR magnitude values for the symbol positions prior to biasing by the LDPC post-processor. In setting LLR magnitude values according to the example of FIG. 6A, during biasing, certain LLR magnitude values may be "clipped." That is, all symbol positions having LLR magnitude values over a certain threshold magnitude value may have their LLR magnitude values reduced to the certain threshold magnitude value during biasing. In the example of FIG. 6A, the certain threshold magnitude value is equal to 7.

During biasing, symbol positions having LLR values that are biased (i.e., have their signs inverted) may receive a magnitude value that is much greater than the certain threshold magnitude value. Thus, in the example of FIG. 6A, symbol positions 608 and 610 are biased, as indicated by the "Change sign" notations, and these symbol positions receive a high magnitude value of 31, as indicated at 618 and 620. By contrast, the symbol positions 602, 604 that are not biased are subject to clipping if they have LLR magnitude values exceeding the certain threshold magnitude value of 7. Thus, symbol position 602, with LLR magnitude value prior to biasing of 5, is not clipped because its magnitude value does not exceed the certain threshold magnitude value of 7, as indicated at 612. Symbol position 604, by contrast, with LLR magnitude value prior to biasing of 10, is clipped, such that it receives the certain threshold magnitude value of 7 during biasing, as indicated at 614.

In FIG. 6B, symbol positions 622, 624, 626, 628 are associated with unsatisfied check 623 and satisfied checks 621, 625. As in FIG. 6A, number values depicted below each of the symbol positions 622, 624, 626, 628 indicate LLR magnitude values for the symbol positions prior to biasing by the LDPC post-processor. In setting LLR magnitude values according to the example of FIG. 6B, during biasing, certain symbol positions' LLR magnitude values are saturated to a certain saturation value. Thus, the certain symbol positions' LLR magnitude values, regardless of whether they exceed the certain saturation value, are saturated to this value during biasing. In the example of FIG. 6B, the certain saturation value is equal to 7. During biasing, symbol positions having LLR values that are biased (i.e., have their signs inverted) may receive a magnitude value that is much greater than the certain saturation value. Thus, in the example of FIG. 6B, symbol positions 626 and 628 are biased, and these symbol positions receive a high magnitude value of 31, as indicated at 634 and 636. By contrast, the symbol positions 622, 624 that are not biased are saturated to the certain saturation value of 7, as indicated at 630, 632.

In both of the examples of FIGS. 6A and 6B, an LLR magnitude value received by the biased symbol positions may be much greater than the LLR magnitude values assigned based on the certain threshold value and/or the certain saturation value. For example, if the LLR magnitude value received by the biased symbol positions is equal to 31, appropriate choices for the certain threshold magnitude value and/or the certain saturation value may be 15, 10, or 7. Setting LLR magnitude values in this manner may improve performance and convergence speed of the LDPC post-processing decoder.

Figure 7:
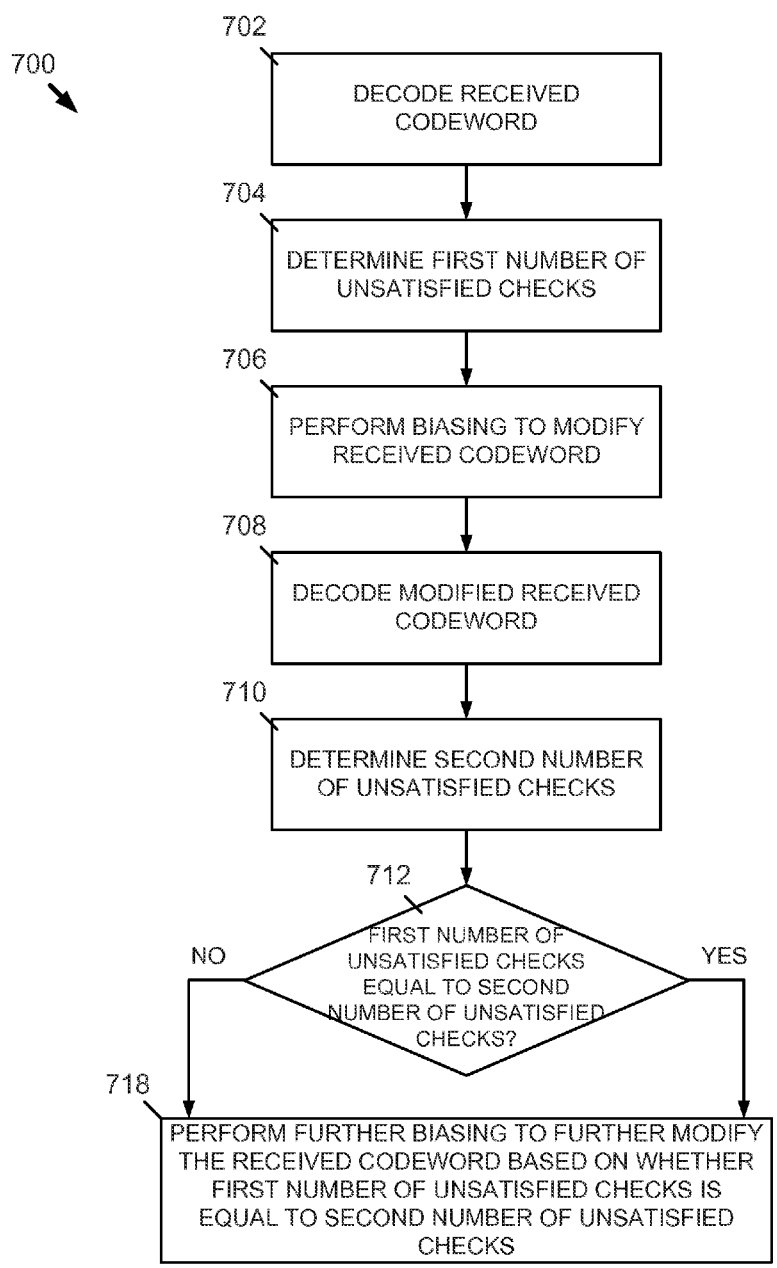
FIG. 7 is a flowchart illustrating an example method for decoding a received codeword based on monitoring a number of unsatisfied checks.

FIG. 7 is a flowchart illustrating an example method 700 for decoding a received codeword based on monitoring a number of unsatisfied checks. Prior to the beginning of the steps of the example method 700, the codeword may be received by an LDPC decoder, as illustrated, for example, by the codeword 122 being received by the LDPC decoder 124 in FIG. 1. At 702, the LDPC decoder decodes the received codeword based on an LDPC code, which produces a plurality of satisfied and unsatisfied checks. At 704, a first number of unsatisfied checks is determined. A number of unsatisfied checks may be referred to as a "syndrome weight." At 706, the received codeword is biased by an LDPC post-processor to produce a modified received codeword. The modified received codeword may be generated, for example, using the techniques illustrated in FIGS. 4A, 4B, 5A, 5B, 6A, and 6B, where certain symbol positions of the received codeword have their LLR values' signs inverted and certain symbol positions have their LLR values' magnitudes modified.

At 708, the modified received codeword is decoded using the LDPC code. Following this decoding, at 710, a second number of unsatisfied checks is determined. Thus, the first number of unsatisfied checks represent the syndrome weight prior to the LDPC post-processor's biasing procedure, and the second number of unsatisfied checks represent the syndrome weight after the biasing. At 712, the first number of unsatisfied checks are compared to the second number of unsatisfied checks to determine if they are equal. At 718, assuming that an actual codeword was not produced as a result of the first or second decoding procedures, the received codeword is further modified by the LDPC post-processor based on whether the first number of unsatisfied checks is equal to the second number of unsatisfied checks.

The method 700 of FIG. 7 may be used, for example, when both decoding operations 702, 708 produce first and second trapping sets, respectively. Thus, when performing the further biasing at 718, the comparison of the first and second number of unsatisfied checks may be used to determine whether to continue biasing with symbol positions associated with the first trapping set or whether to switch to symbol positions associated with the second, newly detected trapping set. For example, if the syndrome weight did not change after the biasing procedure at 706, then the further biasing at 718 may be performed on symbol positions associated with the first trapping set produced after the initial decoding at 702. By contrast, if the syndrome weight did change after the biasing procedure at 706, then the further biasing at 718 may be performed on symbol positions related to the new syndrome. Biasing in this manner may allow an actual codeword to be determined in a faster fashion as compared to a "blind" biasing approach.

Figure 8:
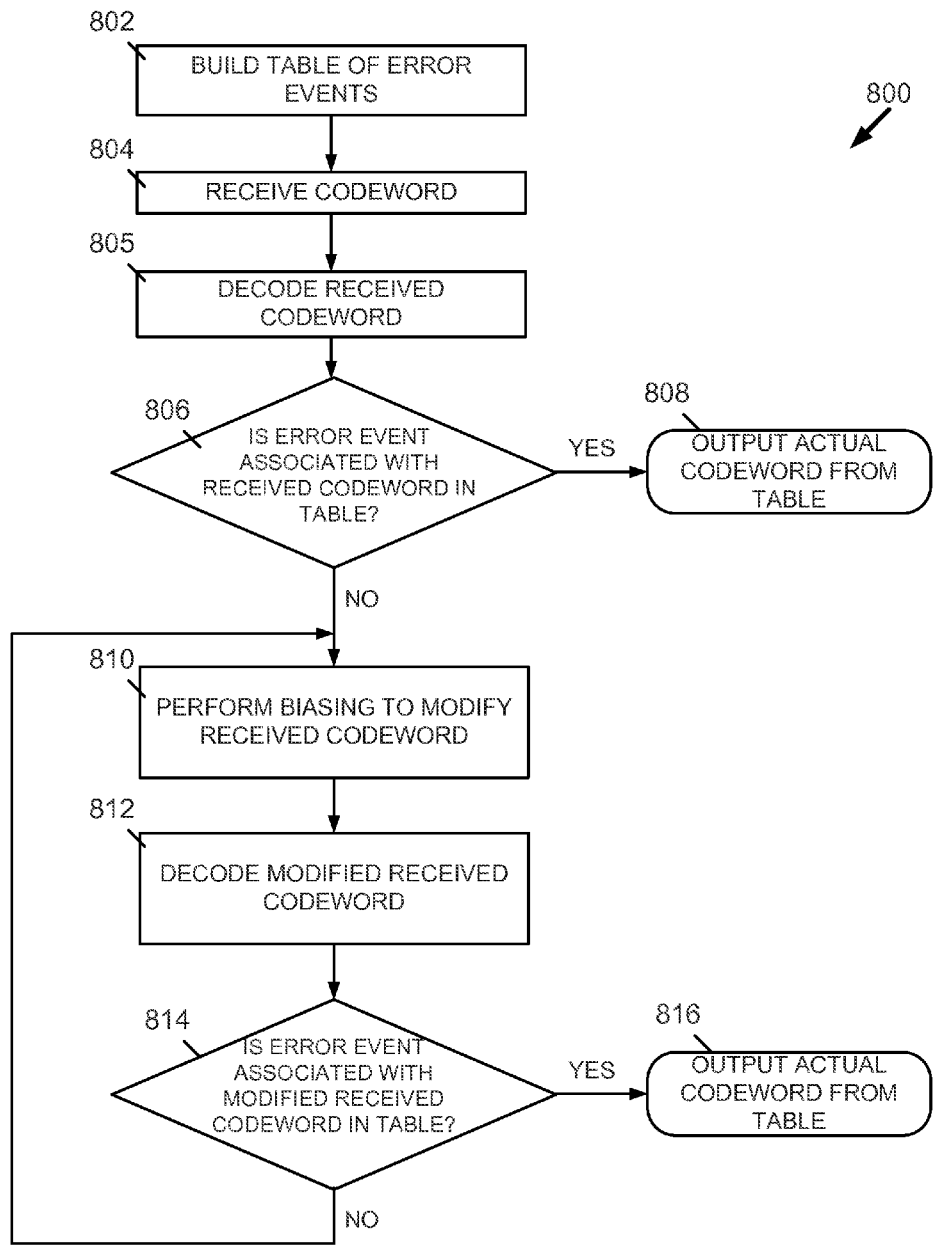
FIG. 8 is a flowchart illustrating a method for implementing a table-lookup procedure within an LDPC decoding process.

FIG. 8 is a flowchart illustrating a method 800 for implementing a table-lookup procedure within an LDPC decoding process. At 802, a table of error events is built. The table may include a plurality of entries, and each entry may include a particular set of symbol positions (i.e., an erroneous codeword), a particular set of satisfied and unsatisfied checks, and an actual codeword associated with the particular sets of symbol positions and checks. The error events of the table may be determined experimentally, for example. At 804, an LDPC decoder receives a codeword, and at 805, the received codeword is decoded by the LDPC decoder to produce an error event associated with the received codeword. The error event may be produced, assuming that the decoding at 805 does not result in a correct, actual codeword. The error event associated with the received codeword may include symbol positions of the erroneous, received codeword and a set of satisfied and unsatisfied checks associated with the erroneous, received codeword. At 806, a determination is made as to whether the error event associated with the received codeword is included in the table. If the error event associated with the received codeword is included in the table, at 808, the correct, actual codeword is output from the table. Because a table-lookup procedure may be very fast, if the error event associated with the received codeword is included in the table, this may be an efficient means of arriving at the correct codeword.

If the error event associated with the received codeword is not included in the table, at 810, an LDPC post-processor performs a biasing procedure to modify the received codeword. The biasing procedure may be performed by the LDPC post-processor according to the techniques described above with respect to FIGS. 4A, 4B, 5A, 5B, 6A, and 6B. At 812, the LDPC decoder decodes the modified received codeword. Similar to the previous decoding step 805, decoding the modified received codeword at 814 produces an error event associated with the modified received codeword. The error event associated with the modified received codeword may include symbol positions of the erroneous, modified received codeword and a set of satisfied and unsatisfied checks associated with the erroneous, modified received codeword. At 814, a second table-lookup procedure is performed to determine if the error event associated with the modified received codeword is included in the table. If the error event associated with the modified received codeword is included in the table, at 816, the correct, actual codeword is output from the table.

If the error event associated with the modified received codeword is not included in the table, the process may return to 810, where another biasing procedure is performed on the modified received codeword. Subsequent table-lookup and biasing procedures may be performed until the actual codeword is determined. Table biasing may be performed after each biasing step because even though a previous error event may not have been found in the table, a subsequent error event may be. A size of the table may vary, and an effectiveness of implementing the table-lookup approach may depend on the table size. In one example, the table may be built with the most likely error events, rather than all possible error events up to a certain size. In another example, the table may be built to include all possible error events. In this example, generating the table may be time and memory consuming, but subsequent decoding may be performed quickly.

Figure 9:
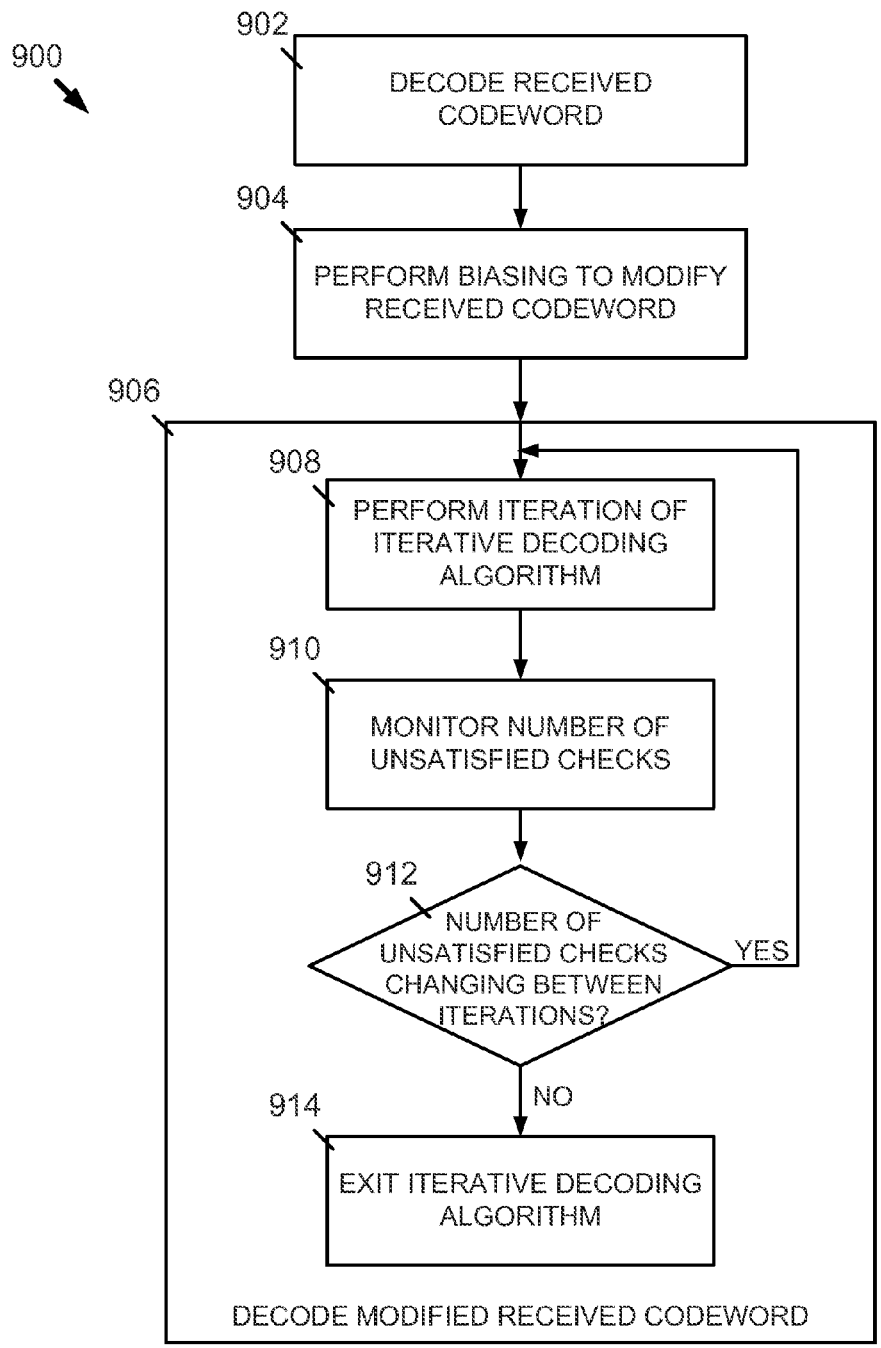
FIG. 9 is a flowchart illustrating an example method of decoding a received codeword that utilizes a syndrome monitoring check step performed after each iteration of an LDPC decoder algorithm's execution.

FIG. 9 is a flowchart illustrating an example method 900 of decoding a received codeword that utilizes a syndrome monitoring check step performed after each iteration of an LDPC decoder algorithm's execution. Prior to operation 902 of the method 900, the LDPC decoder may receive a codeword. The received codeword may be similar to that illustrated at 122 of FIG. 1, and the LDPC decoder may be similar to the LDPC decoders 124, 224 of FIGS. 1 and 2. At 902, the LDPC decoder decodes the received codeword. Assuming that this standard decoding process does not produce a correct, actual codeword, at 904, an LDPC post-processor performs a biasing procedure to modify the received codeword. The biasing procedure at 904 may involve inverting signs of certain symbol positions of the received codeword and/or resetting LLR magnitude values for certain symbol positions of the received codeword.

At 906, the LDPC decoder decodes the modified received codeword using one or more iterations of an iterative decoding process. At 908, a single iteration of the iterative decoding algorithm is performed. At 910, following the single iteration, a number of unsatisfied checks are monitored. At 912, a determination is made as to whether the number of unsatisfied checks is changing between iterations of the iterative decoding algorithm. If the number of unsatisfied checks is changing between iterations, the process returns to 908, where another single iteration of the iterative decoding algorithm is performed. If the number of unsatisfied checks is determined to not be changing between iterations, at 914, the iterative decoding algorithm is exited.

In this manner, the number of unsatisfied checks may be monitored for each particular decoding iteration of a given biasing step. In making the determination at 912 as to whether the number of unsatisfied checks is changing between iterations, the LDPC decoder may be configured to determine that the number of unsatisfied checks is not changing when the number of unsatisfied checks is the same in two, three, or four successive iterations, for example. Further, it may also be required that in addition to the number of unsatisfied checks not changing in two, three, or four iterations, the number of unsatisfied checks must also be below a certain threshold number. In one example, the threshold number of unsatisfied checks may be six or eight. Monitoring the number of unsatisfied checks may be used to eliminate iterations of the iterative decoding algorithm that may be unnecessarily performed after the algorithm has already converged to a particular syndrome. For example, the iterative decoding algorithm of the LDPC decoder may converge to and become stuck on a trapping set after a certain number of iterations, and exiting the decoding procedure at this point may be used to eliminate a number of iterations.

Figure 10:
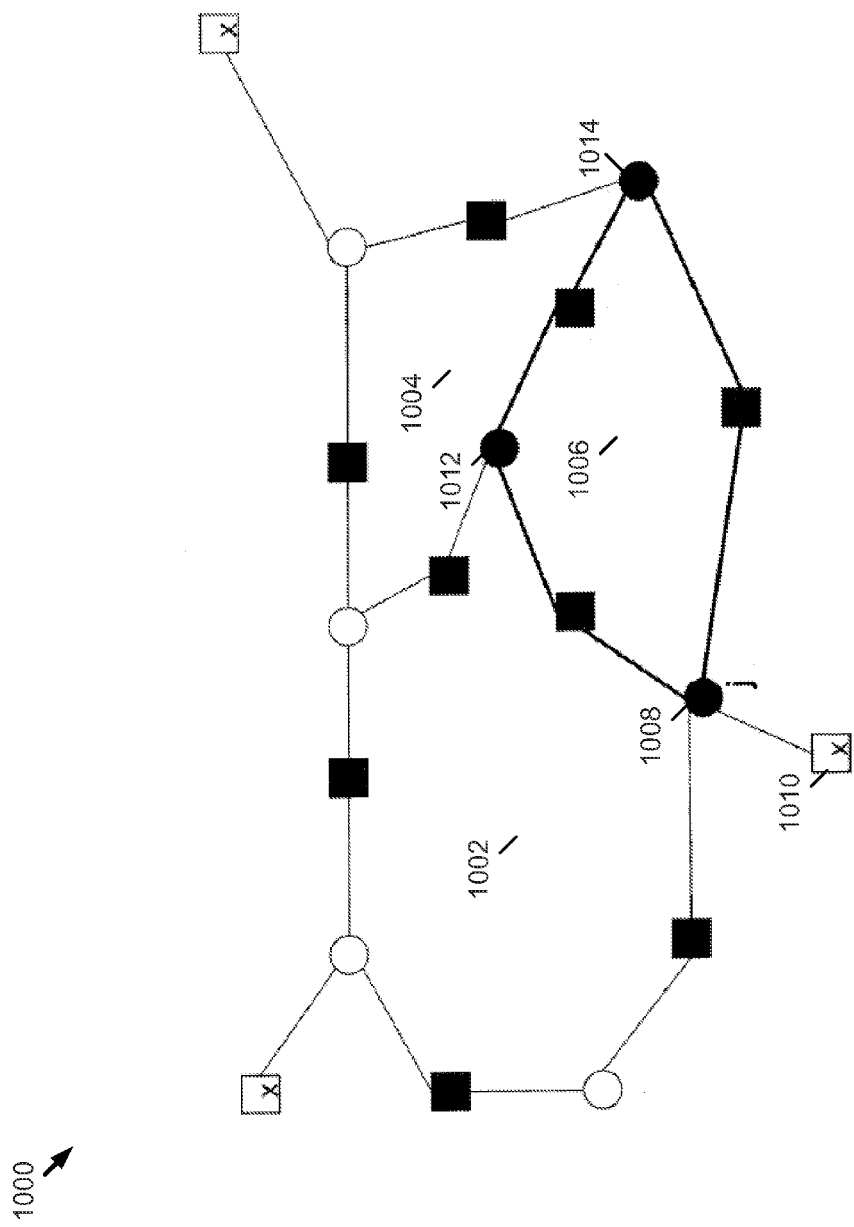
FIG. 10 is a code graph illustrating an example method of LDPC biasing based on cycles.

FIG. 10 is a code graph 1000 illustrating an example method of LDPC biasing based on cycles. An alternative means of representing an LDPC code (as illustrated, for example, in FIG. 3) is via a code graph, such as the code graph 1000 of FIG. 10. Code graphs may be used to illustrate cycles, which are closed loops of the code graph that contain a number of symbol positions and a number of checks. In the example of FIG. 10, three closed-loop cycles 1002, 1004, 1006 are depicted. The cycle 1002 is a cycle of size 10, having five checks (depicted as squares) and five symbol positions (depicted as circles). The cycle 1004 is a cycle of size 8, having four checks and four symbol positions. The cycle 1006 is a cycle of size six, having three checks and three symbol positions. In order to bias multiple symbol positions at once, a plurality of symbol positions of a particular cycle may be biased simultaneously. Such biasing of the plurality of symbol positions within a cycle of a code graph may be used, for example, when error events are "hard errors" that result in trapping sets (i.e., near codewords) of LDPC codes. Thus, biasing over a cycle may be a way to preferentially choose best candidates for performing biasing of three or four symbol positions simultaneously.

An example method of biasing based on cycles of LDPC code graphs may involve selecting a first symbol position to bias in a standard fashion. In the example of FIG. 10, a first symbol position j 1008 is selected based on the fact that it is directly connected to an unsatisfied check 1010 (denoted by an "x" within the check's square). After selecting the first symbol position 1008 for biasing, cycles of certain sizes that are associated with the first symbol position are identified. In the example of FIG. 10, cycles of size 6 may be sought, and thus, the cycle 1006 is selected for performing further biasing. In addition to biasing the symbol position j 1008 directly connected to the unsatisfied check 1010, other symbol positions 1012, 1014 of the cycle 1006 may be selected for biasing. Thus, using this technique, three symbol positions can be preferentially chosen for simultaneous biasing based on their inclusion in the cycle. Selecting three or more symbol positions without using cycles in this manner may be slow, as a very large number of possible multiple-symbol biasing combinations may need to be considered. Biasing based on cycles (e.g., cycles of size six) may also be advantageous because within a particular cycle, there may exist a high likelihood that multiple symbol positions of the cycle are erroneous.

Figure 11:
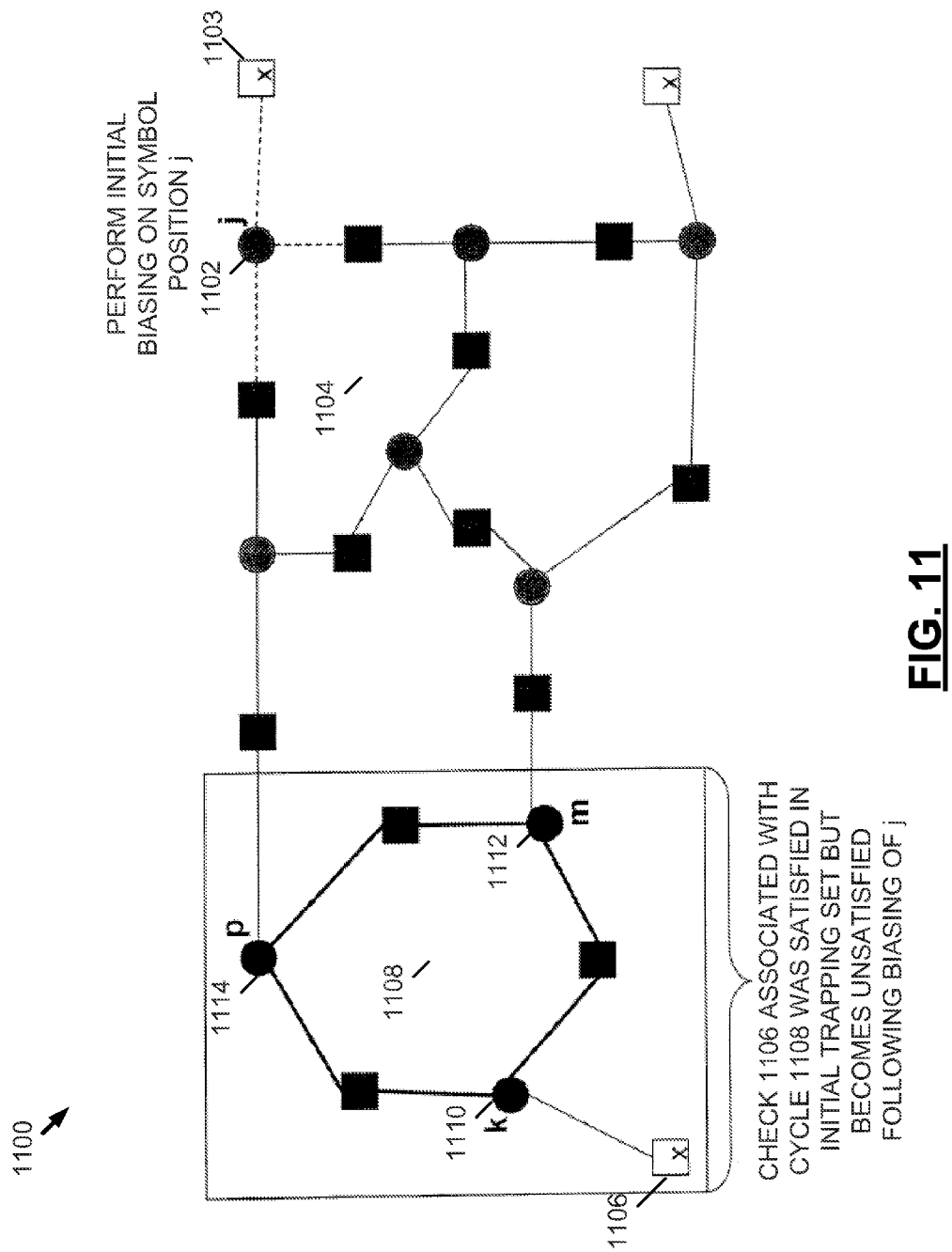
FIG. 11 is a code graph illustrating another example method of LDPC biasing based on cycles.

FIG. 11 is a code graph 1100 illustrating another example method of LDPC biasing based on cycles. The example method of FIG. 11 may be used when a cycle of size six cannot be found initially in the particular part of the code graph after standard decoding. Pursuant to this method, in a first biasing procedure performed by an LDPC post-processor, symbol position j at 1102 is selected for biasing based on its connection to unsatisfied check 1103. As illustrated in cycle 1104 of FIG. 11, the symbol position j 1102 is not part of a cycle of size six, as may be desired. However, by performing biasing in a standard manner (i.e., selecting the symbol position j 1102 based on its connection to an unsatisfied check) and decoding the modified received codeword with an LDPC decoder, the decoder may converge to a new result that does include a cycle of size six. Thus, in the example of FIG. 11, after biasing the symbol position j 1102 and running the decoder, the decoder converges to another (e.g., overlapping) trapping set. In the new, overlapping trapping set, a cycle of size six can be found. In FIG. 11, check 1106, connected to cycle of size six 1108, was satisfied prior to the biasing of symbol position j 1102. Following the biasing of symbol position j 1102 and decoding of it, however, the check 1106 becomes unsatisfied, which allows the post-processor to select multiple symbol positions within cycle 1108 for biasing. In this manner, multiple symbol positions k 1110, m 1112, and p 1114 may be biased simultaneously. Although cycles of size six may be desirable for biasing, cycles of other sizes may similarly be used to achieve preferential selection of multiple symbol positions for biasing.

The biasing techniques and decoding methods described above with respect to FIGS. 6A, 6B, 7, 8, and 9 may be applied to the methods of LDPC biasing based on cycles. For example, with reference to the method 700 of FIG. 7, a number of unsatisfied checks may be determined before and after each LDPC biasing based on cycles in order to determine if the number of unsatisfied checks has changed following the biasing. In this manner, further LDPC biasing based on cycles may be related to the determination of whether the number of unsatisfied checks is changing. The techniques and methods of other FIGS. 6A, 6B, 8, and 9 are equally applicable when biasing is performed based on cycles.

Figure 12:
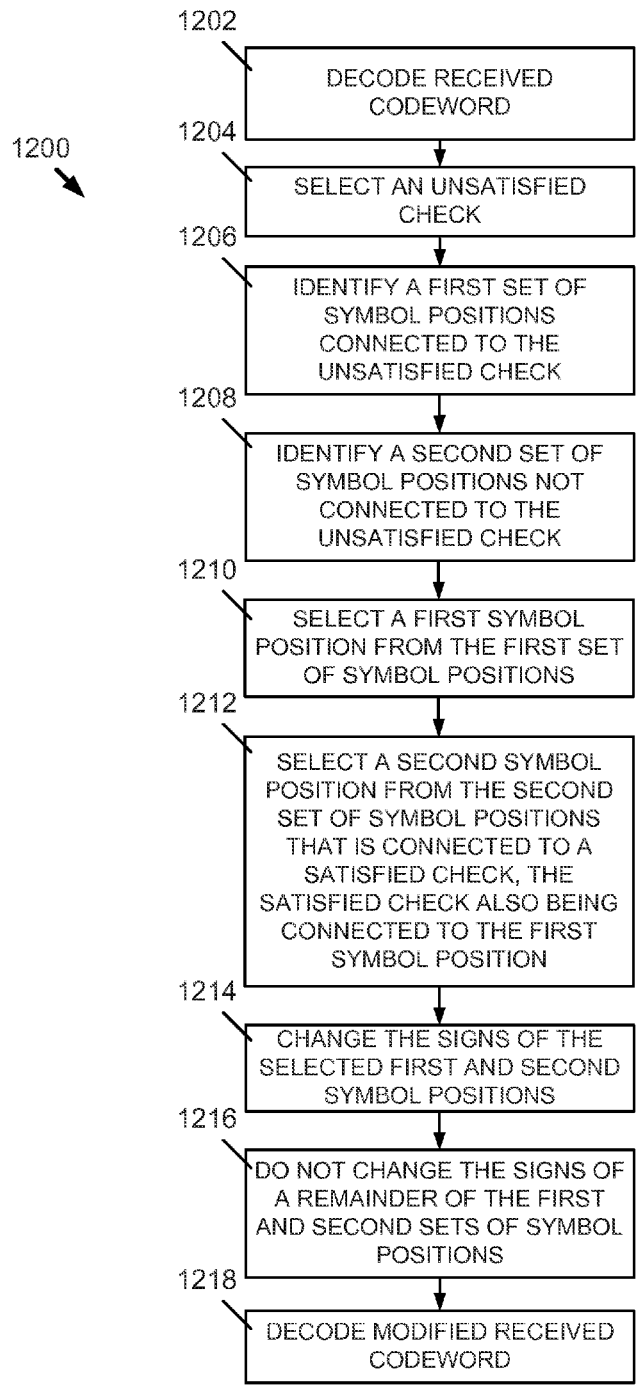
FIG. 12 is a flowchart illustrating an example method for decoding a received codeword.

FIG. 12 is a flowchart 1200 illustrating an example method for decoding a received codeword. At 1202, the received codeword is decoded to produce a plurality of checks. At 1204, an unsatisfied check is selected from the plurality of checks. At 1206, a first set of symbol positions connected to the unsatisfied check is identified. At 1208, a second set of symbol positions not connected to the unsatisfied check is identified. Following the identification of the first and second sets, operations at 1210, 1212, 1214, and 1216 may describe a process for modifying the received codeword. At 1210, a first symbol position from the first set of symbol positions is selected. At 1212, a second symbol position from the second set of symbol positions that is connected to a satisfied check is selected, where the satisfied check is also connected to the first selected symbol position. At 1214, signs are changed for the selected first and second symbol positions. At 1216, signs are not changed for a remainder of the symbol positions of the first and second sets of symbol positions. At 1218, the modified received codeword is decoded.

Figure 13:
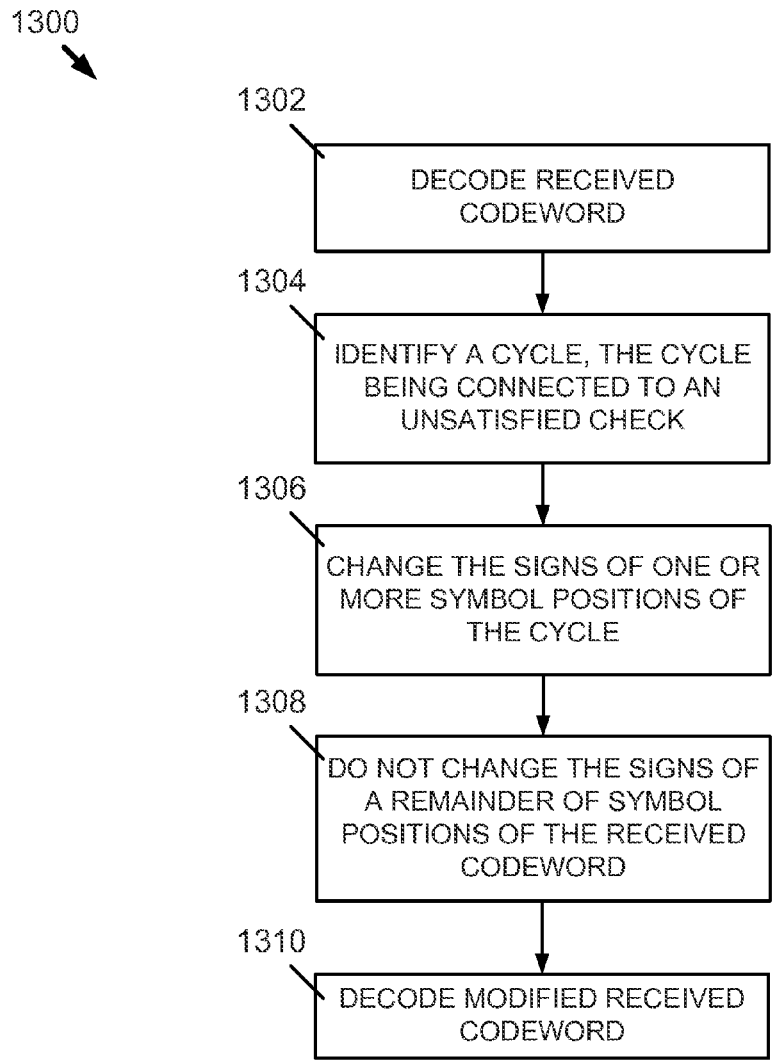
FIG. 13 is a flowchart illustrating another example method for decoding a received codeword.

FIG. 13 is a flowchart 1300 illustrating another example method for decoding a received codeword. At 1302, the received codeword is decoded by an LDPC decoder to produce a plurality of checks and a tentative codeword. Operations 1304, 1306, and 1308 may be performed by an LDPC post-processor to modify the received codeword prior to a subsequent decoding of the modified received codeword by the decoder. At 1304, a cycle having a predetermined size is identified, where the cycle is a closed loop of a code graph produced as a result of decoding the received codeword and is connected to a first unsatisfied check from the plurality of checks. The predetermined size of the cycle may be six, such that a sum of a number of symbol positions and a number of checks of the closed loop is equal to six. At 1306, signs of one or more symbol positions of the cycle are changed (i.e., inverted or flipped). At 1308, signs for a remainder of symbol positions of the received codeword are not changed. At 1310, the LDPC decoder decodes the modified received codeword.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

The invention claimed is:

1. A method of decoding a received codeword, comprising:
   decoding the received codeword based on a parity code to produce a plurality of checks;
   selecting a first unsatisfied check from the plurality of checks;
   identifying a first set of symbol positions in the received codeword connected to the first unsatisfied check;
   identifying a second set of symbol positions in the received codeword not connected to the first unsatisfied check;
   modifying the received codeword, the modifying comprising,
      setting the first set of symbol positions to first predetermined values, and
      setting the second set of symbol positions to second predetermined values; and
   decoding the modified received codeword based on the parity code.

2. The method of claim 1, wherein the parity code is a low-density parity check code, wherein decoding the received codeword based on the parity code produces a tentative codeword, and wherein setting the first and second sets of symbol positions to first and second predetermined values, respectively, comprises:
   selecting a first symbol position from the first set of symbol positions;
   selecting a second symbol position from the second set of symbol positions that is connected to a satisfied check, the satisfied check also being connected to the first symbol position;

setting the selected first and second symbol positions to signs opposite of those of corresponding symbol positions in the tentative codeword;
setting a remainder of the first and second sets of symbol positions to same signs as those of corresponding symbol positions in the tentative codeword.

3. The method of claim 2, wherein the received codeword comprises:
a sign value for each symbol position of the received codeword;
an associated confidence value for each of the sign values, the associated confidence value being a log-likelihood ratio (LLR) value with a magnitude.

4. The method of claim 3, wherein modifying the received codeword further comprises:
identifying symbol positions from the remainder of the first and second sets of symbol positions that have LLR magnitude values exceeding a first magnitude value;
for the identified symbol positions, setting the LLR magnitude values equal to the first magnitude value;
setting LLR magnitude values for the selected first symbol position and the selected second symbol position equal to a second magnitude value, the second magnitude value being greater than the first magnitude value.

5. The method of claim 3, wherein modifying the received codeword further comprises:
setting LLR magnitude values for the remainder of the first and second sets of symbol positions equal to a first magnitude value;
setting LLR magnitude values for the selected first symbol position and the selected second symbol position equal to a second magnitude value, the second magnitude value being greater than the first magnitude value.

6. The method of claim 1, further comprising:
monitoring a number of unsatisfied checks before and after each decoding;
performing a further modification of the received codeword based on whether the number of unsatisfied checks before and after a particular decoding are equal.

7. The method of claim 1, further comprising:
building a table of error events associated with codewords;
performing a table lookup to determine if an error event associated with the received codeword or the modified received codeword is included in the table;
determining an actual codeword for the received codeword based on the table lookup.

8. The method of claim 1, wherein decoding the modified received codeword comprises:
executing, on the modified received codeword, one or more iterations of an iterative decoding algorithm, the method further comprising:
for each iteration of the iterative decoding algorithm, monitoring a number of unsatisfied checks, and
if the number of unsatisfied checks is determined to not be changing between iterations, exiting the iterative decoding algorithm.

9. The method of claim 8, wherein the number of unsatisfied checks is determined to not be changing when the number of unsatisfied checks is the same in two, three, or four successive iterations and the number of unsatisfied checks is below a threshold value.

10. A system for decoding a received codeword, comprising:
a decoder configured to decode the received codeword or a modified received codeword based on a parity code, said decoding of the received codeword being configured to produce a plurality of checks;
a post-processor configured to perform operations including:
selecting a first unsatisfied check from the plurality of checks;
identifying a first set of symbol positions in the received codeword connected to the first unsatisfied check;
identifying a second set of symbol positions in the received codeword not connected to the first unsatisfied check;
modifying the received codeword, the modifying comprising,
setting the first set of symbol positions to first predetermined values, and
setting the second set of symbol positions to second predetermined values.

11. The system of claim 10, wherein the parity code is a low-density parity check code, wherein decoding the received codeword by the decoder based on the parity code produces a tentative codeword, and wherein setting the first and second sets of symbol positions to first and second predetermined values, respectively, comprises:
selecting a first symbol position from the first set of symbol positions;
selecting a second symbol position from the second set of symbol positions that is connected to a satisfied check, the satisfied check also being connected to the first symbol position;
setting the selected first and second symbol positions to signs opposite of those of corresponding symbol positions in the tentative codeword;
setting a remainder of the first and second sets of symbol positions to same signs as those of corresponding symbol positions in the tentative codeword.

12. The system of claim 11, wherein the received codeword comprises:
a sign value for each symbol position of the received codeword;
an associated confidence value for each of the sign values, the associated confidence value being a log-likelihood ratio (LLR) value with a magnitude.

13. The system of claim 12, wherein modifying the received codeword further comprises:
identifying symbol positions from the remainder of the first and second sets of symbol positions that have LLR magnitude values exceeding a first magnitude value;
for the identified symbol positions, setting the LLR magnitude values equal to the first magnitude value;
setting LLR magnitude values for the selected first symbol position and the selected second symbol position equal to a second magnitude value, the second magnitude value being greater than the first magnitude value.

14. The system of claim 12, wherein modifying the received codeword further comprises:
setting LLR magnitude values for the remainder of the first and second sets of symbol positions equal to a first magnitude value;
setting LLR magnitude values for the selected first symbol position and the selected second symbol position equal to a second magnitude value, the second magnitude value being greater than the first magnitude value.

15. The system of claim 10, wherein the post-processor is further configured to perform operations including:
monitoring a number of unsatisfied checks before and after each decoding;
performing a further modification of the received codeword based on whether the number of unsatisfied checks before and after a particular decoding are equal.

16. The system of claim 10, further comprising:
a table of error events associated with codewords, wherein the post-processor is further configured to perform operations including:
performing a table lookup using the table of error events to determine if an error event associated with the received codeword or the modified received codeword is included the table;
determining an actual codeword for the received codeword based on the table lookup.

17. The system of claim 10, wherein decoding the modified received codeword comprises:
executing, on the modified received codeword, one or more iterations of an iterative decoding algorithm, and wherein the decoder or post-processor is further configured to perform operations including:
for each iteration of the iterative decoding algorithm, monitoring a number of unsatisfied checks, and
if the number of unsatisfied checks is determined to not be changing between iterations, exiting the iterative decoding algorithm.

18. The system of claim 17, wherein the number of unsatisfied checks is determined to not be changing when the number of unsatisfied checks is the same in two, three, or four successive iterations and the number of unsatisfied checks is below a threshold value.

* * * * *